US012757656B2

(12) United States Patent
Knaepen et al.

(10) Patent No.: US 12,757,656 B2
(45) Date of Patent: Oct. 6, 2026

(54) METHOD OF FORMING A SILICON COMPRISING LAYER

(71) Applicant: ASM IP Holding, B.V., Almere (NL)

(72) Inventors: Werner Knaepen, Leuven (BE); Arjen Klaver, Neerijse (BE); Dieter Pierreux, Pepingen (BE); Bert Jongbloed, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 613 days.

(21) Appl. No.: 18/312,019

(22) Filed: May 4, 2023

(65) Prior Publication Data

US 2023/0360905 A1 Nov. 9, 2023

Related U.S. Application Data

(60) Provisional application No. 63/338,761, filed on May 5, 2022.

(51) Int. Cl.

*H10P 14/694* (2026.01)
*C23C 16/455* (2006.01)
*H10P 14/60* (2026.01)

(52) U.S. Cl.

CPC .. *H10P 14/69433* (2026.01); *C23C 16/45544* (2013.01); *C23C 16/45553* (2013.01);

(Continued)

(58) Field of Classification Search

CPC ........... H01L 21/0217; H01L 21/02211; H01L 21/0228; C23C 16/45544;

(Continued)

(56) References Cited

U.S. PATENT DOCUMENTS

2007/0087581 A1* 4/2007 Singh ...................... C23C 16/22 257/E21.293
2013/0099324 A1* 4/2013 Huang ............... H10D 62/8503 257/E21.445
2020/0048768 A1* 2/2020 Wiegers ........... C23C 16/45591

OTHER PUBLICATIONS

AlN Surface Passivation of GaN-Based High Electron Mobility Transistors by Plasma-Enhanced Atomic Layer Deposition, Tzou et al. Nanoscale Research Letters (2017)12:315.

(Continued)

*Primary Examiner* — Michael G Miller
(74) *Attorney, Agent, or Firm* — Banner & Witcoff, Ltd.

(57) ABSTRACT

A method for forming a silicon-comprising layer on a substrate may comprise providing the substrate to a process chamber, the process chamber being comprised in a low pressure chemical vapor deposition (LPCVD) furnace. A repetitive deposition cycle is performed. The deposition cycle comprises a first deposition pulse and a second deposition pulse comprising a provision, into the process chamber, of a first precursor and a second precursor, respectively. The deposition cycle further comprises a first purge pulse and a second purge pulse for removing, from the process chamber, a portion of the first precursor and a portion of the second precursor, respectively. The process chamber is maintained, during the deposition cycle, at a process temperature in a range from about 400° C. to about 650° C. and at a first pressure being different from a second pressure, during the first deposition pulse and during the second deposition pulse, respectively.

20 Claims, 1 Drawing Sheet

(52) U.S. Cl.
CPC .... *C23C 16/45574* (2013.01); *H10P 14/6339* (2026.01); *H10P 14/6682* (2026.01)

(58) Field of Classification Search
CPC ........ C23C 16/45553; C23C 16/45574; C23C 16/45527; C23C 16/45546; C23C 16/45557; C23C 16/345
See application file for complete search history.

(56) References Cited

OTHER PUBLICATIONS

Study of the effect of passivation layers on capacitance of AlGaN/GaN heterostructures, Enisherlova et al, Modern Electronic Materials 2 (2016) 131-137.

* cited by examiner

METHOD OF FORMING A SILICON COMPRISING LAYER

TECHNICAL FIELD OF THE DISCLOSURE

The present disclosure is related to the field of semiconductor manufacturing. More specifically, it relates to a method of forming a silicon-comprising layer through repetitively performing a deposition cycle.

BACKGROUND OF THE DISCLOSURE

In the field of semiconductor manufacturing, formation of layers through deposition processes may play one of the key roles. This may have to do with the scaling in feature sizes, on one hand that may require stringent requirements to be observed in the materials properties of semiconductor layers. On the other hand, the change in device architectures may also pose new requirements on the device characteristics to be observed, which may be tailored through the process parameters.

In semiconductor device manufacturing, deposition of dielectric layers may be crucial in terms of acting as insulation, isolation or passivation layers. While chemical vapor deposition (CVD) techniques have been extensively used, the emergence of atomic layer deposition (ALD) techniques are helping to cope with the aforementioned requirements.

The deposition of dielectric layers may, for some device architectures, pose challenges in terms of keeping the integrity of the existing layers on the substrate. This may originate from the process parameters used to deposit the dielectric layers, and may, particularly, be related to the deposition temperatures. Depending on the application, deposition temperatures may lead to dopant deactivation, undesired diffusion of species, surface decomposition, stress in the existing layers on the substrate, particularly in the layers coming in direct contact with the deposited dielectric layers.

There is, therefore, still a need in the art for the formation of layers on substrates with more flexibility in process parameters to obtain the desired film properties and with a reduced risk for the integrity of the existing layers on the substrates and for semiconductor apparatuses configured to form such layers on substrates.

SUMMARY OF THE DISCLOSURE

It is an object of the present disclosure to provide methods that are improved for forming a silicon-comprising layer on a substrate. More specifically, certain embodiments may provide methods that are improved for forming silicon-comprising layers with a lower hydrogen content and with good passivation properties. To at least partially achieve this goal, the present disclosure may provide a method as defined in the independent claim. Further embodiments of the method are provided in the dependent claims.

The present disclosure relates to a method of forming a silicon-comprising layer on a substrate. The method may comprise providing the substrate to a process chamber. The process chamber may be comprised in a low pressure chemical vapor deposition (LPCVD) furnace. A deposition cycle may be performed repetitively, thereby forming on the substrate the silicon-comprising layer. The deposition cycle may comprise a first deposition pulse. The first deposition pulse may comprise a provision of a first precursor into the process chamber. The first precursor may comprise a silicon-containing compound. The deposition cycle may also comprise a first purge pulse for removing a portion of the first precursor from the process chamber. A second deposition pulse may be comprised in the deposition cycle. The second deposition pulse may comprise a provision of a second precursor into the process chamber. The second precursor may comprise a nitrogen-containing compound. The deposition cycle may also comprise a second purge pulse for removing a portion of the second precursor from the process chamber. The process chamber may be maintained at a process temperature in a range from about 400° C. to about 650° C. during the deposition cycle and it may be maintained, during the first deposition pulse, at a first pressure being different from a second pressure, which may be maintained during the second deposition pulse.

The inventive method of the present disclosure may allow for forming the silicon-comprising layer on the substrate with improved thickness control. This may be thanks to the repetitive deposition cycle comprising the deposition and purge pulses. This may provide an advantage in semiconductor device manufacturing by accommodating the reduction in feature sizes, whereby thickness control and thickness reduction is one of the key challenges to be overcome.

Furthermore, the inventive method may allow for forming the silicon-comprising layer on the substrate with lower hydrogen content. This may be thanks to the repetitive deposition cycle being performed at lower temperatures. This may be advantageous in providing improved device performance of semiconductor devices.

Furthermore, it may allow for forming the silicon-comprising layer having good passivation properties. This may also be advantageous in the manufacturing of semiconductor devices; particularly for the manufacturing of Group III-nitride power devices. This may be due to the fact that lower temperature processing for the formation of the silicon-comprising layer may advantageously provide thermal robustness to Group III-nitride layers that may be present in the device structures already before forming the silicon-comprising layer. This may thus be advantageous in terms of lowering device dispersion. Consequently, this may contribute to improving commercial success of such devices.

It may be an advantage of embodiments of the present disclosure that it may allow for forming the silicon-comprising layer with a reduced probability of precursor decomposition or with a reduced probability of particle formation.

It may further be an advantage of embodiments of the present disclosure that it may allow for tuning the stoichiometry of the silicon-comprising layer. This may further be advantageous to tailor the film properties of the silicon-comprising layer according to the desired application.

It may further be an advantage of embodiments of the present disclosure that it may allow for forming the silicon-comprising layer on the substrate provided in a batch processing apparatus. This may be advantageous in increasing the overall fabrication throughput. This may further provide the advantage of reducing the cost of semiconductor manufacturing since a plurality of substrates may be processed in the batch apparatus.

The present disclosure also relates to a LPCVD furnace. The LPCVD furnace may comprise a process chamber, a heater configured for heating the process chamber to a process temperature. It may also comprise a first precursor storage module and a second precursor storage module. The first precursor storage module may comprise a first precursor that may comprise a silicon-containing compound. The second precursor storage module may comprise a second precursor that may comprise a nitrogen-containing compound. A gas delivery assembly may be comprised in the LPCVD furnace for providing the first precursor and the second precursor into the process chamber. A gas exhaust assembly may be comprised in the LPCVD furnace for removing a portion of the first precursor and a portion of the second precursor from the process chamber. A pressure controller may be comprised for maintaining process pressure in the process chamber. The LPCVD furnace may further comprise a controller operably connected to the gas delivery assembly and to the gas exhaust assembly. It may be configured for executing instructions that may be comprised in a non-transitory computer readable medium to cause the LPCVD furnace to form the silicon comprising layer on the plurality of substrates in accordance with a method disclosed in the present disclosure.

By processing a plurality of wafers, the LPCVD furnace may provide the advantage of improving process throughout. This may further help to improve the overall throughput of the semiconductor manufacturing.

The LPCVD furnace may also advantageously enable the formation of silicon-comprising layers having lower hydrogen content. This may then provide the benefit of improving device performance and thus keeping further semiconductor manufacturing.

Furthermore, the LPCVD furnace may advantageously aid in the formation of the silicon-comprising layer providing improved passivation.

BRIEF DESCRIPTION OF THE FIGURES

Reference is made to the drawings included, which are intended for illustration of the aspects and embodiments of the present disclosure. The drawings described are only schematic and are non-limiting.

Like reference numbers will be used for like elements in the drawings unless stated otherwise. Reference signs in the claims shall not be understood as limiting the scope.

DETAILED DESCRIPTION OF THE DISCLOSURE

Figure 1:
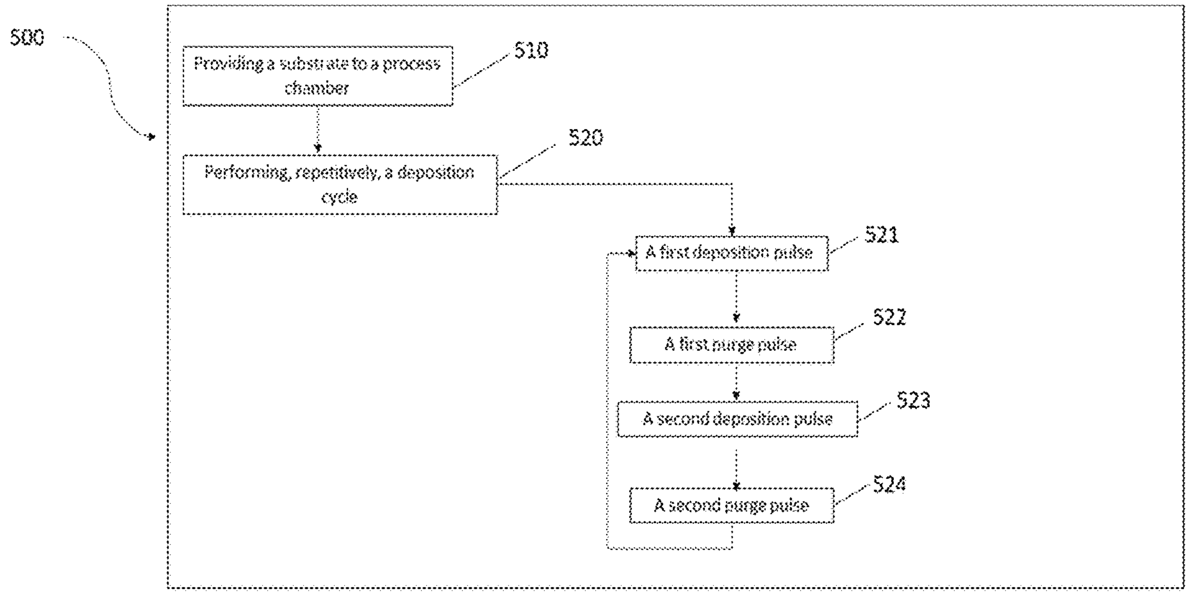
FIG. 1 shows a flowchart of an exemplary method according to embodiments of present disclosure.

The present disclosure will be described with respect to particular embodiments and with reference to certain drawings. However, the disclosure is not limited thereto but only by the claims.

It should be understood that in the description of exemplary embodiments of the disclosure, various features of the disclosure are sometimes grouped together in a single embodiment, figure or description in order to help to understand one or more of the inventive aspects. The claims following the detailed description are incorporated into the detailed description, with each claim standing on its own as a separate embodiment of the disclosure.

It is to be noticed that the term "comprising", used in the claims, should not be interpreted as being restricted to the means listed thereafter. It does not exclude other elements or steps. It is thus, to be interpreted as specifying the presence of the stated features, steps or components as referred to. However, it does not prevent one or more other steps, components, or features, or groups thereof from being present or being added.

The terms first, second, third and the like appearing in the description and the claims, are there to help in distinguishing between similar elements or similar features. Thus, they are not used necessarily for describing an order or a sequence in any manner. It is to be understood that such terms can be interchangeable under suitable conditions. It is thus further to be understood that the embodiments of the disclosure described in the description are capable of being used in other sequences than the described ones.

Reference throughout the specification to "embodiments" in various places throughout the specification are not necessarily all referring to the same embodiment, but may. Furthermore, the particular features, structures or characteristics may be combined in any suitable manner, as would be apparent to one of the ordinary skill in the art from the disclosure, in one or more embodiments.

Reference throughout the specification to "some embodiments" means that a particular structure, feature step described in connection with these embodiments is included in some of the embodiments of the present disclosure. Thus, phrases appearing such as "in some embodiments" in different places throughout the specification are not necessarily referring to the same collection of embodiments, but may.

It is to be noticed that the term "comprise substantially" used in the claims indicates that further components than those specifically mentioned can, but not necessarily have to, be present, namely those not materially affecting the essential characteristics of the material, compound, or composition referred to.

Some embodiments described herein include some but not other features included in other embodiments. However, combinations of features of different embodiments are meant to be within the scope of the disclosure, and form different embodiments, as would be understood by those in the art. In the claims included, any of the claimed embodiments can, for example, be used in any combination.

The following terms are provided only to help in the understanding of the disclosure.

As used herein and unless provided otherwise, the term "device dispersion" refers to the indication that the dynamic characteristics of a AlGaN/GaN HEMT device are different from the static characteristics.

As used herein and unless provided otherwise, the term "Si-rich" refers to a silicon-comprising layer having a refractive index in the range of 2.2 to 2.3 measured at a wavelength of 632.8 nm.

As used herein and unless provided otherwise, the term "Si-poor" refers to a silicon-comprising layer having a refractive index in the range of 1.9 to 2.0 measured at a wavelength of 632.8 nm. Refractive index can be measured by ellipsometry.

The disclosure will now be described by a detailed description of several embodiments of the disclosure. It is to be understood that other embodiments of the disclosure can be configured according to the knowledge of persons skilled in the art without departing from the technical teaching of the disclosure, the disclosure being limited only by the terms of the appended claims.

FIG. 1 presents a flowchart of an exemplary method according to embodiments of the present disclosure.

The method (500) of forming a silicon-comprising layer on a substrate may comprise providing (510) the substrate to a process chamber, the process chamber being comprised in a low pressure chemical vapor deposition (LPCVD) furnace.

The LPCVD furnace may, in embodiments, be a vertical furnace. The process chamber may, thus, extend in a vertical direction in the vertical furnace. The vertical furnace may therefore, accommodate a plurality of substrates in the process chamber. Therefore, the silicon-comprising layer may, in embodiments, be formed on the plurality of substrates. The plurality of substrates may be arranged in a wafer boat, the wafer boat being receivable in the process chamber. The wafer boat may hold a batch of 100 to 200 substrates for processing in the process chamber of the vertical furnace.

The vertical furnace may thus, be advantageous in terms of improving the throughput of the layer formation process, while also contributing to the increase in the overall fabrication throughput. This may be due to the decrease achieved in wafer processing per unit time thanks to the processing of plurality of substrates at once.

In some embodiments, the LPCVD furnace may be a horizontal furnace. The horizontal furnace may, in some embodiments, be a horizontal batch furnace. The process chamber may, thus, extend in a horizontal direction in the horizontal furnace. The plurality of substrates may, in some embodiments, be positioned perpendicular to the direction of the flow of the process gas.

In yet some embodiments, the LPCVD furnace may be such that it can accommodate the processing of a single substrate at a time.

In some embodiments, the substrate or the plurality of substrates may be semiconductor substrates.

In these embodiments, the semiconductor substrate may be a Si (100) substrate, a Si (110) substrate, or a Si (111) substrate.

In some embodiments, the substrate or the plurality of substrates may comprise a layer. This layer may, in embodiments, be a semiconductor layer or a dielectric layer. This layer may, in some embodiments, be at least partially comprised in an upper surface of the substrate thus, in other words may be exposed to ambient.

In embodiments, the layer that may be comprised in the substrate may be a Group III-nitride containing layer. In these embodiments, the silicon-comprising layer may be formed at least partially on the Group III-nitride containing layer.

The Group Ill-nitride containing layer may, in some embodiments be $Al_XGa_{1-X}N$, wherein $0 \leq X \leq 1$.

Formation of the silicon-comprising layer at least partially on the Group Ill-nitride containing layer may be advantageous in cases, where the silicon-comprising layer is preferred for providing the advantage of good passivation properties and lower hydrogen content. This may, particularly, be advantageous in the manufacturing of Group Ill-nitride high-electron-mobility transistors (HEMTs) or Group Ill-nitride power devices. The passivation properties that may be offered by the silicon-comprising layer may be advantageous in lowering device dispersion. Device dispersion may refer to the difference between the dynamic characteristics and the static characteristics of a device. Thus, the lower this difference, the lower the dispersion may be. As such, good passivation properties may be advantageous in improving breakdown voltage of the device, saturation current and noise level. One of the dominant sources of device dispersion is known to be due to the surface in a AlGaN/GaN HEMT. This is associated with surface states that are introduced during device processing. Therefore, an optimized process for providing the passivation layer may offer the advantage of overcoming these challenges, thus, helping to improve device performance by lowering dispersion.

In some embodiments, the layer that may be comprised in the substrate may be a semiconductor layer of Si (100), or a semiconductor layer of Si (110), or a semiconductor layer of Si (111).

In embodiments, one or more surface layers may be present or may be formed on the substrates.

The method (500) may further comprise performing (520), repetitively, a deposition cycle, thereby forming on the substrate the silicon-comprising layer. The repetitive performance of the deposition cycle may provide the advantage of keeping a tight control on the thickness of the silicon-comprising layer. The repetitive deposition cycle may be executed N times until a desired thickness is achieved. The number N times of repetition of the cycle may thus, depend on the growth rate of the layer. Having the tight control on the thickness of the silicon-comprising layer may provide the advantage of keeping up with scaling in semiconductor industry, where layer thicknesses are reducing as well as feature sizes. Furthermore, it may provide the advantage of improving device characteristics such as, for example, improving breakdown voltage, saturation current and noise level of Group III-nitride devices, particularly when the silicon-comprising layer is used a passivation layer.

The deposition cycle (520) may comprise a first deposition pulse (521) and a second deposition pulse (523). The first deposition pulse may comprise a provision of a first precursor into the process chamber, while the second deposition pulse may comprise a provision of a second precursor into the process chamber. The first precursor and the second precursor may react with each other to form the silicon-comprising layer in an atomic layer deposition process (ALD). As such, it is to be understood that the first precursor may be different than the second precursor.

The deposition cycle (520) may further comprise a first purge pulse (522) for removing a portion of the first precursor from the process chamber and a second purge pulse (524) for removing a portion of the second precursor from the process chamber after the first deposition pulse (521) and after the second deposition pulse (523), respectively.

In embodiments, the first precursor and the second precursor may be a gas.

In embodiments, the first purge pulse and the second purge pulse may comprise a provision of an inert gas. The inert gas may, in embodiments, comprise substantially $N_2$.

In some embodiments, the inert gas may be comprised substantially of one or more noble gases such, for example, Ar, Xe, He, Ne and Kr. In some embodiments, the inert gas may be comprised substantially of at least one of $N_2$ and one or more of noble gases.

In some embodiments, the inert gas may also comprise hydrogen gas.

In embodiments, the first purge pulse may have a first duration to remove the portion of the first precursor from the process chamber, while the second purge pulse may have a second duration to remove the portion of the second precursor from the process chamber.

In embodiments, the first duration and the second duration may be from at least 4 seconds to at most 300 seconds. In some embodiments, the first duration of the first purge pulse may be from at least 5 seconds to at most 300 seconds. In some embodiments, the first duration of the first purge pulse may be in a range from at least 20 seconds to 40 seconds. In some embodiments, the first duration of the first purge pulse may be 40 seconds.

In some embodiments, the second duration of the second purge pulse may be from at least 4 seconds to at most 300 seconds. In some embodiments, the second duration of the second purge pulse may be in a range from at least 40 seconds to 120 seconds. In some embodiments, the second duration of the second purge pulse may be 100 seconds.

The process chamber may be maintained, during the deposition cycle, at a process temperature in a range from about 400° C. to about 650° C. and at a first pressure during the first deposition pulse and at a second pressure during the second deposition pulse, the first pressure being different than the second pressure. The deposition cycle may thus, offer a widened process window for the formation of the silicon-comprising layer in terms of temperature, while also offering process stability thanks to the differing process pressures maintained during the first deposition pulse and the second deposition pulse.

It is to be understood that precursors may behave differently as a function of process pressure. The process pressure may play a role on the stability of the precursor, thus on the process stability. Decomposition of the precursor, which may thus, pose a challenge to its stability, may occur when the precursor is used within a certain range of process pressures. A decomposed precursor may increase the risk of particle formation and thereby, leading to contamination problems in the process chamber or in other parts of the processing apparatus. This may then lead to an increase in preventive maintenance cycles of the processing apparatus or in a decrease in process yield. This may thus lead to a decrease in process throughput or a decrease in overall fabrication throughput.

Therefore, the method of forming the silicon-comprising layer disclosed in the present disclosure may be advantageous in reducing the risk for precursor decomposition. This is due to the fact that the process pressure of forming the silicon-comprising layer is tailored as a function of the precursor used in the first deposition pulse and in the second deposition pulse, respectively. Thus, while the disclosed method may provide the advantage of reducing the risk for particle contamination, it may also offer the benefit of providing a wide window in terms of the process temperature.

In embodiments, the process chamber may be maintained, during the deposition cycle, at a process temperature in a range from about 450° C. to about 650° C. In some embodiments, the process chamber may be maintained, during the deposition cycle, at a process temperature in a range from about 500° C. to about 600° C. In some embodiments, the process chamber may be maintained, during the deposition cycle, at a process temperature in a range from about 500° C. to about 525° C., or from about 525° C. to about 550° C., or from about 550° C. to about 575° C., or from about 575° C. to about 600° C.

In embodiments, a thermocouple placed inside the process chamber may be used to follow the temperature in the process chamber. The thermocouple may be situated in an upper section of the process chamber and above an upper section of the wafer boat holding the plurality of substrates. In some embodiments, a plurality of thermocouples may be situated in the process chamber. Each of the plurality of thermocouples may be placed at locations different from one another inside the process chamber. This may provide the advantage of obtaining a better temperature control inside the process chamber.

In some embodiments, the process chamber may be maintained, during the deposition cycle, at a process temperature in a range from about 510° C. to about 550° C. This may provide an advantage in terms of the stability of the layer that the silicon-comprising layer is formed upon. Without wishing to be bound by theory, it may be stated that the temperature of subsequent processes may influence the stability of existing layers comprised in a substrate, particularly when subsequent processes are used to form films being, at least partially, in direct contact with the existing layers. Process temperatures of the subsequent layers being higher than what the existing layers can withstand may thus, increase the risk of creation of surface states or surface decomposition of the existing layers. This may eventually influence the device performance.

In embodiments, the first pressure and the second pressure may be in a range of 1 Torr to 100 Torr.

In some embodiments, the first pressure may be lower than the second pressure. As the first precursor is different from the second precursor, this may provide the advantage of reducing the risk of decomposition of the first precursor compared to the situation where the first pressure and the second pressure were to be kept the same. This may then help to optimize consumption of the first precursor contrary to the situation where precursor might decompose, thus requiring unplanned precursor replenishment. Furthermore, it may reduce the risk for increased preventive maintenances as precursor decomposition may lead to contamination due to the particle formation that may occur as a result of decomposition.

In embodiments, the first pressure, which is the pressure that the process chamber is maintained during the first deposition pulse, may be in a range from about 6 Torr to about 10 Torr and the second pressure, which is the pressure that the process chamber is maintained during the second deposition pulse, may be in a range from about 15 Torr to about 25 Torr. This may provide the advantage of lowering hydrogen content in the silicon-comprising layer formed.

Hydrogen content in the layer is typically influenced by process temperature. Therefore, the higher the process temperature, the lower the hydrogen content in the film will likely be. Consequently, for processes favoring low process temperatures, the risk for increased hydrogen content in the layer to be formed may increase as the process temperature is decreased.

In embodiments, the pressure that the process chamber is maintained during the first deposition pulse, may be in a range from about 6 Torr to about 8 Torr, or from about 8 Torr to about 10 Torr.

In embodiments, the pressure that the process chamber is maintained during the second deposition pulse, may be in a range from about 15 Torr to about 17 Torr, or from about 17 Torr to about 19 Torr, or from about 19 Torr to about 21 Torr, or from about 21 Torr to about 23 Torr, or from about 23 Torr to about 25 Torr Therefore, by setting the first pressure in the range from about 6 Torr to about 10 Torr and the second pressure in the range from about 15 Torr to about 25 Torr may provide the advantage of reducing the risk for increased hydrogen content in the silicon-comprising layer that is to be formed, which may be triggered due to the lower process temperatures disclosed in the present disclosure, particularly when the process temperature may be in the range of from about 510° C. to about 550° C.

In embodiments, the pressure in the process chamber may be measured by a pressure transducer, which is connected by a line to the process chamber. In this line, there may be a reduced $N_2$ flow for allowing to prevent deposition on the PT. Connection of the line is made in the bottom of the process chamber.

In embodiments, the first precursor may be provided into the process chamber at a first flow rate being lower than a second flow rate of the second precursor. This may be advantageous in terms of obtaining a reduced pressure build up. This may provide the advantage of overcoming the decomposition of the first precursor. Furthermore, the first flow rate being lower than the second flowrate may help to improve the uniformity of the silicon-comprising layer formed on the substrate.

In embodiments, the first flow rate may be up to 500 sccm, while the second flow rate may be up to 770 sccm. In embodiments, different combinations of flowrate values pertaining to the first flow rate and to the second flow rate may be possible. On the other hand, the dose of the first and/or the second precursor may be tailored in order to tune the film properties.

In embodiments, the provision of the first precursor, into the process chamber, may be different than the provision of the second precursor, in terms of the duration of the provision. This may be advantageous when the first precursor and the second precursor require differing times from one another to interact with the surface of the substrate. Precursors that take longer time to interact may thus be provided for a longer duration into the process chamber than those taking shorter time to interact with the surface of the substrate. This may then allow for tailoring the stoichiometry of the silicon-comprising layer formed on the substrate. Thus, in exemplary embodiments, where the silicon-comprising layer is a silicon nitride layer, this may help to tailor the stoichiometry of this silicon nitride layer.

In embodiments, the provision of the first precursor, into the process chamber, may be shorter than the provision of the second precursor. This may provide the advantage of tailoring the stoichiometry of the silicon-comprising layer. In other words, it may help to adjust the silicon content in the silicon-comprising layer formed. This may thus, be advantageous in obtaining a Si-rich or a Si-poor layer as may be needed by a specific application.

In some embodiments, the provision of the first precursor, into the process chamber may be in a range from 1 second to 60 seconds. In some embodiments, the provision of the second precursor into the process chamber may be in a range from 1 second to 120 seconds.

In some embodiments, the provision of the first precursor into the process chamber may be between 20% to 70% shorter than the provision of the second precursor. In preferred embodiments, the provision of the first precursor into the process chamber may be 50% shorter than the provision of the second precursor.

In embodiments, the silicon-containing compound may be a silicon halide having the formula $Si_nX_yH_{2n+2-y}$, where X is a halogen such as, CI, Br, I or F and where n=1−10 and where y=1 or more and may be up to 2n+2. In some embodiments, n may be from 1 to 3, and in some embodiments, n may be from 1 to 2.

In some embodiments, where the halogen is CI, then the silicon-containing compound may be a chlorinated silicon-containing compound such as for example, monochlorosilane (MCS), dichlorosilane (DCS), trichlorosilane (TCS), hexachlorodisilane (HCDS), octachlorotrislane (OCS), and silicon tetrachloride (STC).

In preferred embodiments, the silicon halide may thus be dicholorosilane (DCS).

In embodiments, the nitrogen-containing compound may be a nitrogen hydride. The nitrogen hydride may, in some embodiments, be ammonia ($NH_3$), diazene ($N_2H_2$) or hydrazine ($N_2H_4$).

In preferred embodiments, the nitrogen hydride may be ammonia ($NH_3$).

The second precursor may further comprise an oxidizing gas. The oxidizing gas may, in some embodiments be, water ($H_2O$), oxygen ($O_2$), ozone ($O_3$), nitrous oxide ($N_2O$) or hydrogen peroxide ($H_2O_2$).

In embodiments, the provision of the first precursor and the second precursor into the process chamber may be done by the use of a gas injector. The gas injector may be comprised in the process chamber, and the first precursor and the second precursor may be provided alternatingly through the gas injector.

The gas injector, in some embodiments may extend in the vertical direction when comprised in the process chamber of the vertical LPCVD furnace. The gas injector may in some embodiments extend in the vertical direction along the height of the wafer boat. The gas injector may, in embodiments, comprise a plurality of gas injection holes spaced apart vertically from one another.

In embodiments, the provision of the inert gas that may be comprised in the first purge pulse and in the second purge pulse may also be done through the gas injector. This may then offer the benefit of removing the first precursor and the second precursor also from the gas injector, thereby providing cleaning of the gas injector in between the provisions of the different precursor gases used in the method disclosed herein.

In some embodiments, the gas injector may be provided in the horizontal LPCVD furnace for providing the first precursor and the second precursor.

In some embodiments, the process chamber may comprise two gas injectors, namely a first gas injector and a second gas injector. The first precursor and the second precursor may thus be alternatingly provided into the process chamber from the first gas injector and from the second gas injector, respectively.

In some embodiments, the two gas injectors may be identical to one another.

In some embodiments, each of the two gas injectors may be optimized for use with the first and with the second precursor, respectively. This optimization may provide the advantage of adjusting each of the gas injectors in terms of the flow of the first precursor and the second precursor and/or depending on the physical properties of the first precursor and the second precursor in view of the process parameters such as for example, the process temperature or process pressure. The adjustment may comprise optimizing the dimensions of the gas injectors, such as the height, diameter, width and even the shape. It may further comprise adjusting the parameters relating to the number, the size and the placement or orientation of the gas injection holes. This may then offer the benefit in terms of optimizing such as for example, precursor usage, uniformity of deposition, reduce particle creation. Allowing to optimize precursor usage may lead to economic processing. Obtaining the benefit in terms of uniformity of deposition may help to improve process yield and may provide improved reliability for the subsequent processes. Reduction of particle creation may allow for reducing the frequency and number of preventive maintenance cycles, which may help to carry out an economic process.

In some embodiments, the silicon-comprising layer may be a silicon nitride layer. The silicon nitride layer formed according to the embodiments of the method disclosed herein may provide the advantage of having a lower hydrogen content. This silicon nitride layer may in some embodiments be represented as $Si_3N_4$.

Figure 2:
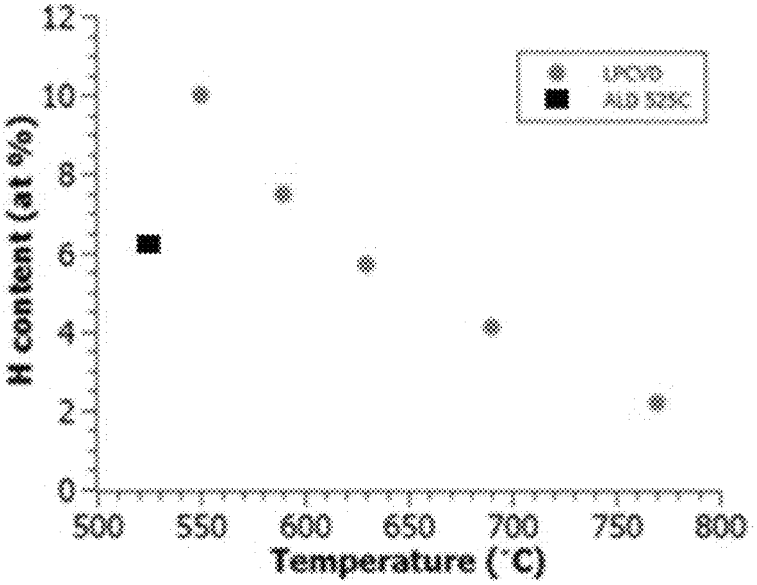
FIG. 2 illustrates a comparison of the hydrogen content in the silicon-comprising layer, given in atomic percentage, as a function of process temperature.

FIG. 2 shows a comparison of the hydrogen content in the silicon-comprising layer, being a silicon nitride layer, given in atomic percentage, as a function of process temperature. The silicon nitride layer is formed by LPCVD in one set of experiments and by ALD in another set of experiments, whereby the same precursors were used by both of the depositions. The silicon nitride layer formed by LPCVD was obtained at a process pressure in the range of 100 mTorr to 200 mTorr.

The silicon nitride layer formed by ALD was obtained according to the embodiments of the present disclosure.

It is observed that the silicon nitride layer formed by ALD enables a lower temperature deposition process resulting in reduced hydrogen content in the layer. Hydrogen content in the layer was measured using secondary ion measurement spectroscopy (SIMS).

In some embodiments, the silicon-comprising layer may be a silicon carbide, a silicon oxynitride or a silicon oxycarbide layer. The choice of the silicon-comprising layer may depend on its use or on the specific type of the device architecture that it will be used in.

In embodiments, a LPCVD furnace for forming a silicon-comprising layer on a plurality of substrates may be provided. The LPCVD furnace may comprise a process chamber and a heater configured for heating the process chamber to a process temperature. The process temperature is the temperature during which the repetitive deposition cycle, according to the embodiments of the present disclosure, is to be carried out. The LPCVD furnace may further comprise a first precursor storage module and a second precursor storage module. The first storage module may comprise a first precursor that may comprise a silicon-containing compound. The second precursor storage module may comprise a second precursor that may comprise a nitrogen-containing compound. Further, a gas delivery assembly and a gas exhaust assembly may be comprised in the LPCVD furnace. The gas delivery assembly may be suitable for providing the first precursor and the second precursor into the process chamber. The gas exhaust assembly may be suitable for removing a portion of the first precursor and a portion of the second precursor from the process chamber. The LPCVD furnace may further comprise a pressure controller that may be configured for maintaining the process pressure in the process chamber. The process pressure is the pressure at which the process chamber is maintained during the repetitive deposition cycle according to the embodiments of the present disclosure.

The LPCVD furnace may further comprise a controller that may be operably connected to the gas delivery assembly and to the gas exhaust assembly and it may be configured for executing instructions comprised in a non-transitory computer readable medium to cause the LPCVD furnace to form the silicon comprising layer on the plurality of substrates with a method as described herein.

The LPCVD furnace may thus provide the advantage of enabling the formation of a silicon-comprising layer on the plurality of substrates. This may thereby improve process throughput and also overall manufacturing throughput. Furthermore, the LPCVD furnace may aid the formation of silicon-comprising layer that may advantageously possess lower hydrogen content and that may advantageously offer improved passivation properties.

The invention claimed is:

1. Method of forming a silicon-comprising layer on a substrate, the method comprising:

providing the substrate to a process chamber, the process chamber being comprised in a low pressure chemical vapor deposition (LPCVD) furnace, and performing, repetitively, a deposition cycle, thereby forming on the substrate the silicon-comprising layer, wherein the deposition cycle comprises:

a first deposition pulse comprising a provision of a first precursor, comprising a silicon-containing compound, into the process chamber, a first purge pulse for removing a portion of the first precursor from the process chamber, a second deposition pulse comprising a provision of a second precursor, comprising a nitrogen-containing compound, into the process chamber, and a second purge pulse for removing a portion of the second precursor from the process chamber, wherein the process chamber is maintained at a process temperature in a range from about 400° C. to about 650° C. during the deposition cycle, and wherein the process chamber is maintained at a first pressure, during the first deposition pulse and at a second pressure during the second deposition pulse, the first pressure being different from the second pressure to at least reduce decomposition.

2. The method according to claim 1, wherein the process chamber is maintained at a process temperature in a range from about 510° C. to about 550° C. during the deposition cycle.

3. The method according to claim 1, wherein the first pressure is lower than the second pressure.

4. The method according to claim 1, wherein the first pressure is in a range from about 6 Torr to about 10 Torr and wherein the second pressure is in a range from about 15 Torr to about 25 Torr.

5. The method according to claim 1, wherein the first precursor is provided into the process chamber at a first flow rate being lower than a second flow rate of the second precursor.

6. The method according to claim 5, wherein the first flow rate is up to 500 sccm and wherein the second flow rate is up to 770 sccm.

7. The method according to claim 1, wherein the provision of the first precursor, into the process chamber, is shorter than the provision of the second precursor.

8. The method according to claim 1, wherein the silicon-containing compound is a silicon halide.

9. The method according to claim 1, wherein the nitrogen-containing compound is a nitrogen hydride.

10. The method according to claim 9, wherein the nitrogen hydride is $NH_3$ or $N_2H_2$.

11. The method according to claim 1, wherein the silicon-comprising layer is formed on a plurality of substrates arranged in a wafer boat, the wafer boat being receivable in the process chamber.

12. The method according to claim 1, wherein the process chamber comprises a gas injector and wherein the first precursor and the second precursor are alternatingly provided into the process chamber through the gas injector.

13. The method according to claim 1, wherein the process chamber comprises two gas injectors, a first gas injector and a second gas injector, and wherein the first precursor and the second precursor are alternatingly provided into the process chamber from the first gas injector and from the second gas injector, respectively.

14. The method according to claim 1, wherein the LPCVD furnace is a vertical furnace.

15. The method according to claim 1, wherein the substrate comprises a Group III-nitride containing layer, and wherein the silicon-comprising layer is formed at least partially on said layer.

16. The method according to claim 1, wherein the silicon-comprising layer is a silicon nitride layer.

17. Method of forming a silicon-comprising layer on a substrate, the method comprising:

providing the substrate to a process chamber, the process chamber being comprised in a low pressure chemical vapor deposition (LPCVD) furnace, and performing, repetitively, a deposition cycle, thereby forming on the substrate the silicon-comprising layer, wherein the deposition cycle comprises:

a first deposition pulse comprising a provision of a first precursor, comprising a silicon-containing compound, into the process chamber, a first purge pulse for removing a portion of the first precursor from the process chamber, a second deposition pulse comprising a provision of a second precursor, comprising a nitrogen-containing compound, into the process chamber, and a second purge pulse for removing a portion of the second precursor from the process chamber, wherein the process chamber is maintained at a process temperature in a range from about 400° C. to about 650° C. during the deposition cycle, and wherein the process chamber is maintained at a first pressure during the first deposition pulse and at a second pressure during the second deposition pulse, the first pressure being different from the second pressure to at least reduce hydrogen content.

18. The method of claim 17, wherein the first precursor is provided into the process chamber at a first flow rate being lower than a second flow rate of the second precursor.

19. The method of claim 17, wherein the first pressure is lower than the second pressure.

20. The method of claim 17, wherein the provision of the first precursor, into the process chamber, is shorter than the provision of the second precursor.

* * * * *